(12) United States Patent
Kurosawa et al.

(10) Patent No.: US 12,313,977 B2
(45) Date of Patent: May 27, 2025

(54) FILM FORMATION DEVICE, FILM FORMATION METHOD, AND ARTICLE MANUFACTURING METHOD

(71) Applicant: CANON KABUSHIKI KAISHA, Tokyo (JP)

(72) Inventors: Hiroshi Kurosawa, Tochigi (JP); Toshiki Ito, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 268 days.

(21) Appl. No.: 17/870,102

(22) Filed: Jul. 21, 2022

(65) Prior Publication Data
US 2022/0357667 A1 Nov. 10, 2022

Related U.S. Application Data

(63) Continuation of application No. PCT/JP2021/004765, filed on Feb. 9, 2021.

(30) Foreign Application Priority Data

Feb. 25, 2020 (JP) .................................. 2020-029576

(51) Int. Cl.
*G03F 7/00* (2006.01)
*H01L 21/027* (2006.01)

(52) U.S. Cl.
CPC ........ *G03F 7/70191* (2013.01); *H01L 21/027* (2013.01)

(58) Field of Classification Search
CPC .. G03F 7/70191; G03F 7/70291; G03F 7/703; H01L 21/027; H01L 21/0273
See application file for complete search history.

(56) References Cited

U.S. PATENT DOCUMENTS 8,976,370 B2 * 3/2015 Miyakawa ......... G01B 11/0633
356/630
9,146,481 B2 * 9/2015 Ota ..................... G03F 7/70291
(Continued)

FOREIGN PATENT DOCUMENTS

CN 101278375 A 10/2008
CN 103105739 A 5/2013
(Continued)

OTHER PUBLICATIONS

International Search Report issued in Intl. Appln. No. PCT/JP2021/004765 mailed Apr. 20, 2021. English translation provided.
(Continued)

*Primary Examiner* — Hung V Nguyen
(74) *Attorney, Agent, or Firm* — ROSSI, KIMMS & McDOWELL LLP

(57) ABSTRACT

A film formation device for forming a film of a composition on the substrate by irradiating the composition on the substrate with light, includes an optical modulation unit for forming a distribution of an integrated light amount of the light on the substrate, and a control unit for controlling the optical modulation unit, in which the control unit controls the distribution of the integrated light amount of the optical modulation unit on the basis of residual film ratio characteristics of the composition and at least one of a curved shape of an imaging plane of an original template used in a subsequent process and a surface shape of a base film formed on the substrate.

13 Claims, 13 Drawing Sheets

(56) References Cited

U.S. PATENT DOCUMENTS 9,171,919 B2 * 10/2015 Ishikawa ........... H01L 29/78675
9,415,418 B2     8/2016 Sreenivasan et al.
9,484,274 B2 * 11/2016 Bencher ................. H01L 22/20

FOREIGN PATENT DOCUMENTS

| CN | 110286562 A | 9/2019 |
|----|-------------|--------|
| JP | 2001144009 A | 5/2001 |
| JP | 2007140166 A | 6/2007 |
| JP | 2008134614 A | 6/2008 |
| JP | 2011066087 A | 3/2011 |
| JP | 2013171984 A | 9/2013 |
| JP | 2014066870 A | 4/2014 |
| TW | 201129865 A | 9/2011 |
| TW | 201235781 A | 9/2012 |

OTHER PUBLICATIONS

Written Opinion issued in Intl. Appln. No. PCT/JP2021/004765 mailed Apr. 20, 2021.
Office Action issued in Chinese Appln. No. 202180015996.1, mailed Mar. 21, 2025.

* cited by examiner

FIG. 6A
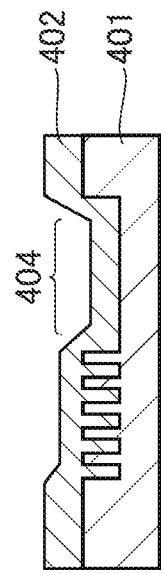
FIG. 6B
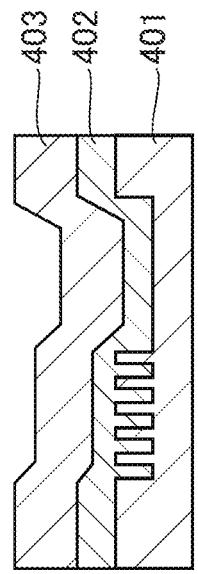
FIG. 6C
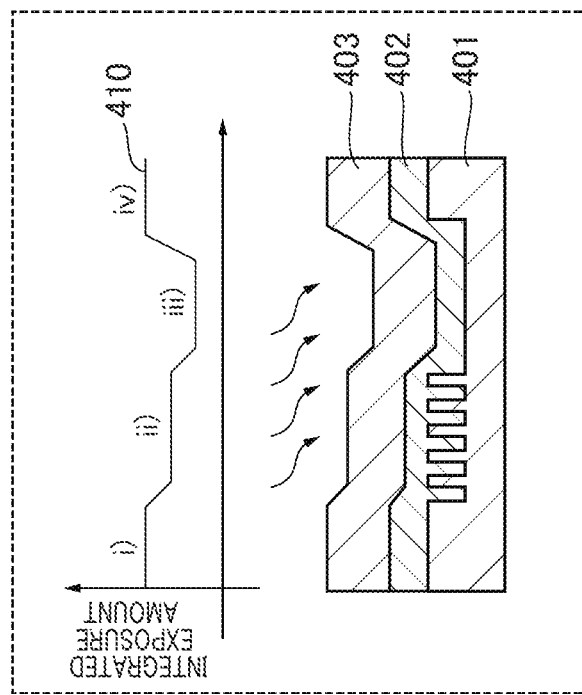
FIG. 6(D)
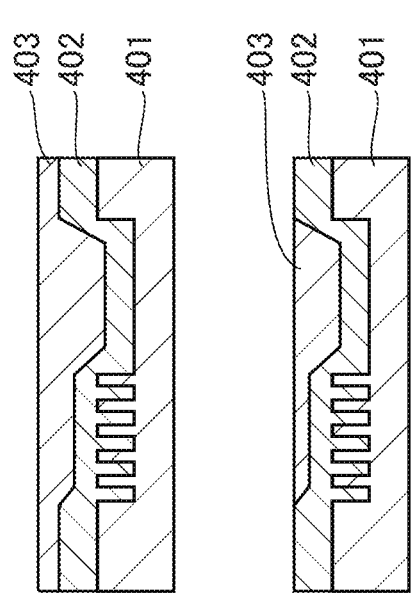
FIG. 6(E)
FIG. 6(F)

FILM FORMATION DEVICE, FILM FORMATION METHOD, AND ARTICLE MANUFACTURING METHOD

BACKGROUND OF THE INVENTION

Field of the Invention

The present invention relates to a film formation device, a film formation method, and an article manufacturing method.

Description of the Related Art

A photolithography technology is utilized in manufacture of articles such as semiconductor devices. A photolithography technology includes a process of forming a resist pattern by transferring a pattern of an original template (reticle) to a photoresist film disposed on a substrate using an exposure device to form a latent image pattern, and developing this. With evolution in resolution of exposure devices, a depth of focus of a projection optical system in exposure devices has been extremely reduced. For example, in a scanning exposure device used for forming a line-and-space pattern of 5 to 7 nm, unevenness accuracy required in an exposure slit is 4 nm or less. Therefore, a planarized film may be formed on a base pattern existing on a surface of a substrate, and a photoresist film may be disposed thereon.

U.S. Pat. No. 9,415,418 proposes a method in which an ultraviolet curable type resist is jetted onto a wafer by changing a density thereof, a transparent thin plate serving as a reference of a flat surface is pressed thereon, and the resist is irradiated with ultraviolet light to be cured while it is in a transitional reflow state.

In an exposure device utilized in a photolithography process, NA of a projection optical system has become high for reducing a minimum resolution dimension, and thereby a depth of focus (DOF) of the projection optical system has been reduced. For example, in an EUV exposure device having a projection optical system with an NA of 0.33, although it depends on lighting conditions, the DOF is 110 nm to 300 nm. In the next generation in which the NA is 0.55, although it depends on lighting conditions, the DOF may be about 40 nm to 160 nm.

Since defocus is caused by various factors, it may not be possible for an unevenness (height difference) on a surface of a substrate to be absorbed for any DOF. Therefore, in order to satisfy the DOF under all lighting conditions even in the generation with an NA of 0.55, unevenness on a surface of a substrate needs to be suppressed to, for example, 4 nm or less.

TABLE 1

| Defocus factors of reticle image | Details of factors |
| --- | --- |
| Caused by exposure device (including flatness of reticle) | 1. Flatness of reticle<br>2. Surface plate deformation<br>3. Aberration of projection optical system<br>4. Flatness of wafer chuck<br>5. Stage servo, trajectory calculation error<br>6. Measurement error correction residue caused by pattern unevenness<br>7. Stability of focus sensor |
| Caused by process wafer | 8. Pattern unevenness<br>9. Non-uniformity of surface shape of shot region within wafer surface |

Table 1 shows factors causing defocus in a photolithography process. It is necessary to cause all of the factors 1 to 9 to fall within a DOF of the exposure device. Factors 1 to 7 are factors on the exposure device side including a reticle. Factors 8 and 9 are wafer-derived factors. A spin on carbon (SOC) layer, which is generally utilized in semiconductor processes after the 45 nm node, is a technology in which factors 8 and 9 are improved.

As an example of planarization of a process wafer using the SOC layer, a three-layer structure in which an SOC layer, a planarized SOG intermediate (HM) layer, and a photoresist layer for a photolithography process are laminated on a base with unevenness is known. The planarized photoresist layer is patterned by a photolithography process using an exposure device. As an example of improving flatness of the SOC layer, a thermosetting type or ultraviolet curable type resist is spin-coated on a surface of a patterned wafer and baked in an environment of about 200° C. Then, there is a method of curing the resist by reheating or irradiation with UV light after a reflow of the resist reaches an equilibrium state.

The individual factors listed in Table 1 are required to be improved according to reduction in the DOF. However, the factors caused by an exposure device have already been reduced as much as possible, and there is a limit to the approach of pursuing planarization of a surface of a process wafer as in conventional cases.

One of objects of the present invention is to provide an advantageous technology for causing an exposure region of a substrate to fall within a DOF of an exposure device.

SUMMARY OF THE INVENTION

According to an aspect of the present invention, a film formation device for forming a film of a composition on a substrate by irradiating the composition on the substrate with light comprises an optical modulation unit for forming a distribution of an integrated light amount of the light on the substrate, and a control unit for controlling the optical modulation unit, wherein the control unit controls the distribution of the integrated light amount of the optical modulation unit on the basis of residual film ratio characteristics of the composition and at least one of a curved shape of an imaging plane of an original template used in a subsequent process and a surface shape of a base film formed on the substrate.

Further features of the present invention will become apparent from the following description of embodiments with reference to the attached drawings.

BRIEF DESCRIPTION OF THE DRAWINGS

FIGS. 6A to 6F illustrate an order of forming the focus compensation film focusing on one shot on the process wafer in the order of time series.

DESCRIPTION OF THE EMBODIMENTS

Hereinafter, embodiments will be described in detail with reference to the accompanying drawings. Further, the following embodiments do not limit the invention according to the claims. Although a plurality of features are described in the embodiments, not all of the plurality of features are essential for the invention, and the plurality of features may be arbitrarily combined. Further, in the accompanying drawings, components the same as or similar to each other are denoted by the same reference signs, and duplicate explanations will be omitted.

First Embodiment

Figure 1:
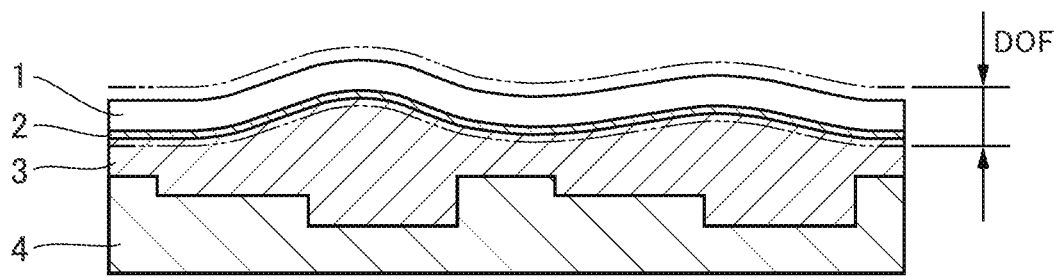
FIG. 1 is a schematic view exemplarily illustrating a structure manufactured by a film formation device and a film formation method according to a first embodiment as an example.

FIG. 1 is a schematic view exemplarily illustrating a structure manufactured by a film formation device and a film formation method according to a first embodiment. A process wafer (process substrate) 4 has unevenness on a surface. In the present specification, such unevenness on the surface of the process wafer 4 also is called a base film. The unevenness on the surface may depends on a pattern of the process wafer 4. The process wafer 4 may have, for example, a layer that is patterned later by etching. A focus compensation film 3 may be formed on the process wafer 4. The focus compensation film 3 may have a thickness, for example, in a range of 60 nm to 200 nm, but may have other thicknesses.

A spin on glass (SOG) film 2 may be disposed on the focus compensation film 3 as an optional element. The SOG film 2 may be utilized as a hard mask when a layer under the focus compensation film 3 is etched. A resist layer (photoresist layer) 1 may be formed on the focus compensation film 3 or the SOG film 2. A pattern of a reticle (original template) is transferred to the resist layer 1 as a latent image pattern in an exposure process performed using an exposure device, and then may be converted into a resist pattern through a development process. In FIG. 1, the two dotted lines indicate a DOF of the exposure device in the exposure process for the resist layer 1. A best focus plane of the exposure device is preferably positioned within a range of the DOF indicated by the two lines.

In one aspect of a device application, unevenness (for example, 80 to 100 nm) caused by a device pattern of the process wafer 4 tends to increase as lamination of a memory device increases. On the other hand, in an exposure device, the DOF reduces as NA of a projection optical system becomes higher. In an EUV exposure device having a projection optical system with an NA of 0.33, the DOF is 110 nm to 300 nm although it depends on lighting conditions. In the next generation in which the NA is 0.55, the DOF may be about 40 nm to 160 nm although it depends on lighting conditions. According to this, in order to satisfy the DOF under all lighting conditions even in the generation of NA=0.55, the surface unevenness of the process wafer 4 needs to be suppressed to 4 nm or less, and planarization only for the surface of the process wafer may not be sufficient. That is, an approach that satisfies DOF requirements by making trade-offs between correction items of three parties including the process wafer 4, a template such as a reticle (a transmission type or a reflection type) used in a subsequent process, and the projection optical system is necessary. Here, the subsequent process is a process of transferring a pattern onto the process wafer 4.

In the present embodiment, an amount of deviation (hereinafter referred to as "scan image plane") of a pattern projection image from a flat surface caused by a device used in the subsequent process including the reticle or the like is measured in advance, and a shape of the scan image plane based on the measurement result is formed in advance on the process wafer. Thereby, improvement in focus performance in the exposure process is achieved. In other words, the focus compensation film 3 having a surface shape corresponding to a shape of the image plane of the device used in the subsequent process is formed so that the resist layer 1 of the process wafer 4 fits within the DOF of the device used in the subsequent process including the reticle or the like. Ultimately, in the present embodiment, a film thickness distribution for each position of the focus compensation film 3 is adjusted so that a center of the resist layer 1 follows a shape of the image plane of a subsequent device.

Here, a shape of the image plane of the exposure device is, for example, a shape that can be evaluated as a curvature of field. An imaging plane of a reticle image by a projection lens of a semiconductor manufacturing device such as an exposure device is designed and adjusted to be ideally a flat surface. However, there is an amount that deviates from the flat surface due to an imaged height (XY position coordinates of a projection image) caused by factors such as deviation of a reticle pattern surface from a flat surface in design, uncorrected lens aberration, or the like, and this, including a higher-order deformation component, is called a curvature of field.

In the exposure device configured as a stepper, since it is a batch exposure within a shot, a deviation of the imaging plane in the shot from the flat surface is the same as the curvature of field. This can be obtained, for example, by measuring a deviation from the best focus plane in a result of shot exposure in which a test pattern is exposed. In a case of a scan exposure device, a component of deviation of the imaging plane of an exposure slit smaller than a shot size from the flat surface corresponds to the curvature of field. Further, similarly to the stepper, one in which a deviation in the result of the shot exposure in which the test pattern is exposed from the best focus plane is measured is called a scan image plane to distinguish it from the curvature of field. However, the curvature of field in a transverse direction of the exposure slit is averaged with respect to a scan exposure direction, and a position control error factor of the scan stage is added to a deterioration factor of the curvature of field.

Figure 2:
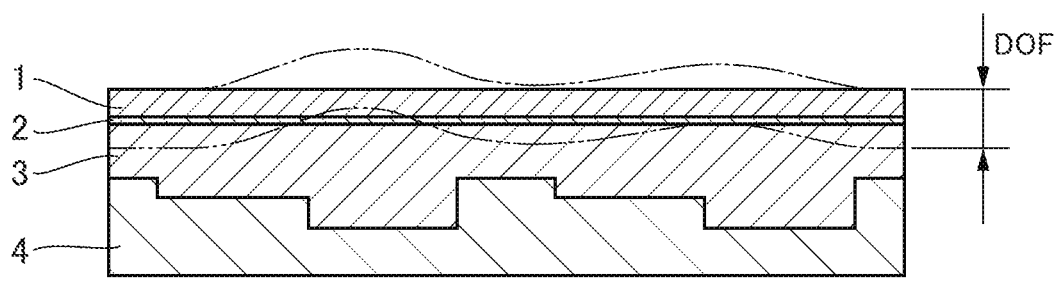
FIG. 2 is a view illustrating a conventional example for forming a focus compensation film 3.

FIG. 2 is a view illustrating a conventional example for forming the focus compensation film 3. In such a conventional example, an absolute flat surface in an exposure slit is assumed as a target image plane to secure the DOF in a subsequent exposure process (pattern transfer process), and measures are taken on the basis of an index of smoothing and flattening undulation components from the target image plane. That is, a measure for improving the DOF in which the scan image plane is assumed as a curved surface has not been taken in the conventional example. Defocus factors in the exposure slit include those described as follows. (1) Device factors such as an exposure device (projection optical system, deformation of a main body, flatness of a wafer chuck, residue of focus control, and sensor accuracy), (2) Reticle flatness, and (3) Process wafer factors (pattern unevenness in design within a shot, unevenness within a wafer surface), or the like. If there is a sufficient DOF margin, conventional measures directed at an absolute flat surface for each factor is effective. On the other hand, if the DOF margin is not sufficiently given, since budget allocations for these will not be established, the present embodiment is an effective measure.

Figure 3:
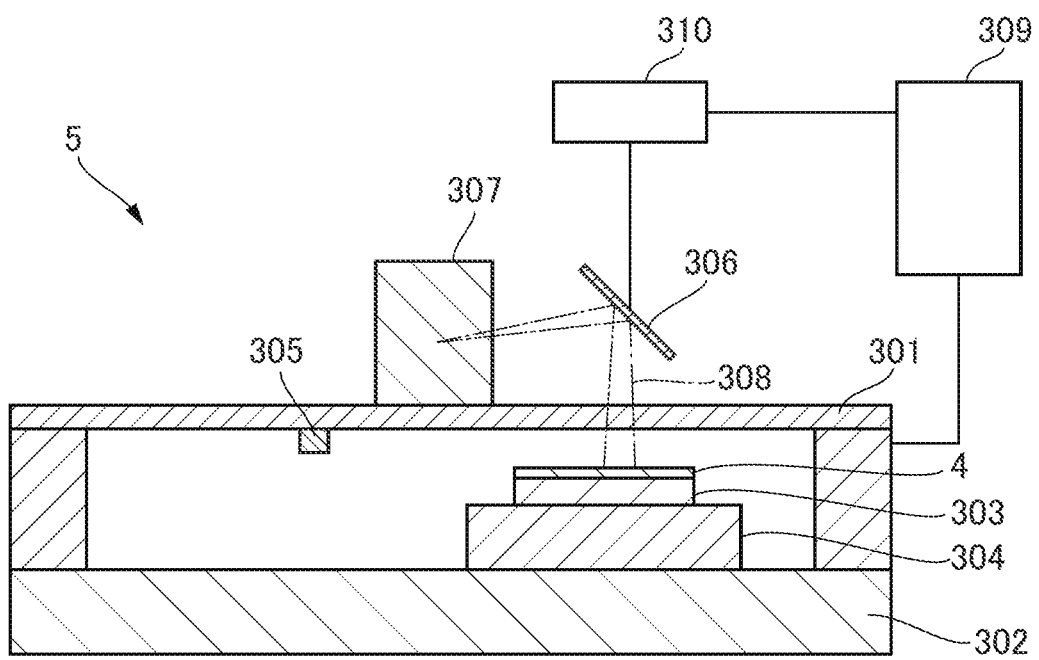
FIG. 3 is a schematic view illustrating a configuration example of the film formation device according to the first embodiment.

FIG. 3 is a schematic view illustrating a configuration example of the film formation device 5 according to the first embodiment. The film formation device 5 includes a wafer chuck 303 that adsorbs and holds the process wafer 4, and a wafer stage 304 (substrate holding part) on which the wafer chuck 303 is mounted. The wafer stage 304 is movable in a plane direction in the film formation device 5.

The film formation device 5 may include an alignment scope 305. The alignment scope 305 may be supported by a bridge 301 coupled to a base surface plate 302. After the process wafer 4 is conveyed to the wafer chuck 303 and held by the wafer chuck 303, a position of the process wafer 4 may be measured using the alignment scope 305. The alignment scope 305 measures a position of the wafer with the bridge 301 as a reference. The position of the process wafer 4 measured by the alignment scope 305 is reflected in a target value of the wafer stage 304 when an exposure position is driven.

Figure 4A:
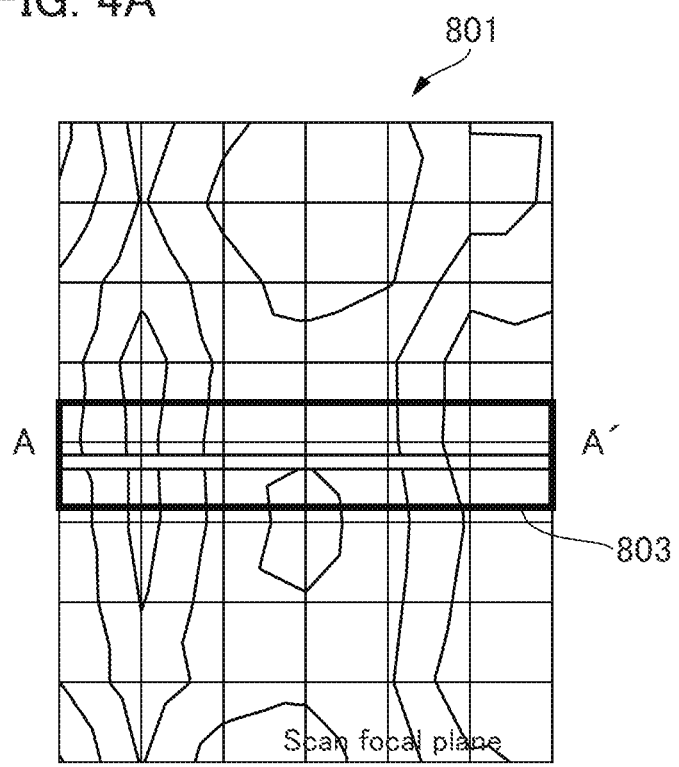
FIG. 4A and FIG. 4B are contour diagrams showing examples of shapes of the image plane of the film formation device 5.
Figure 4B:
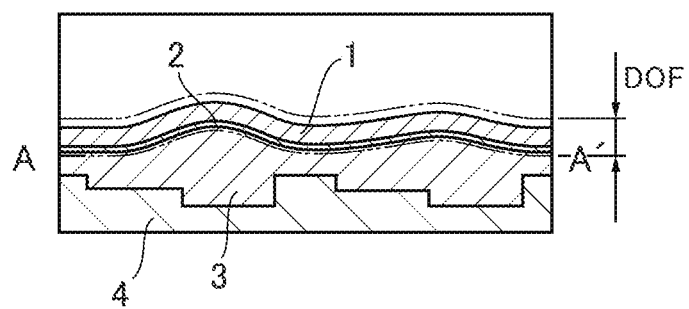
Figure 5A:
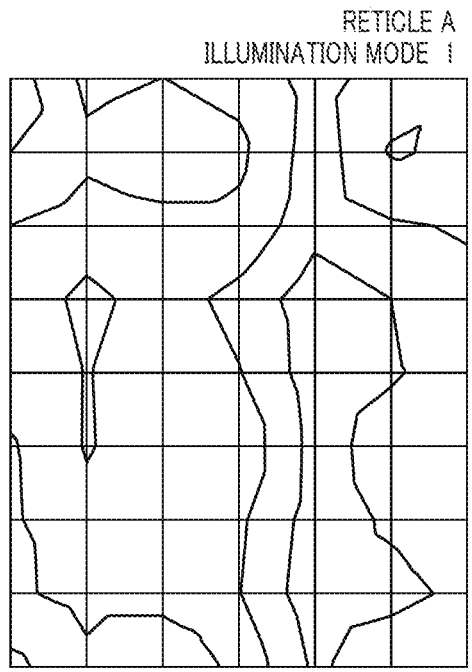
FIGS. 5A to 5D are contour diagrams showing other examples of shapes of the image plane of the film formation device.
Figure 5B:
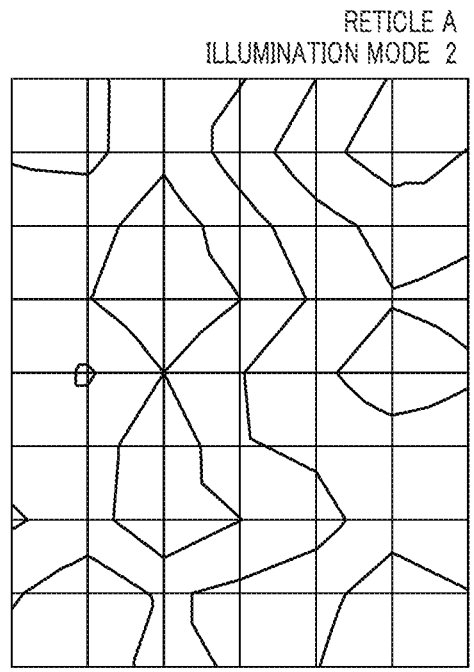
Figure 5C:
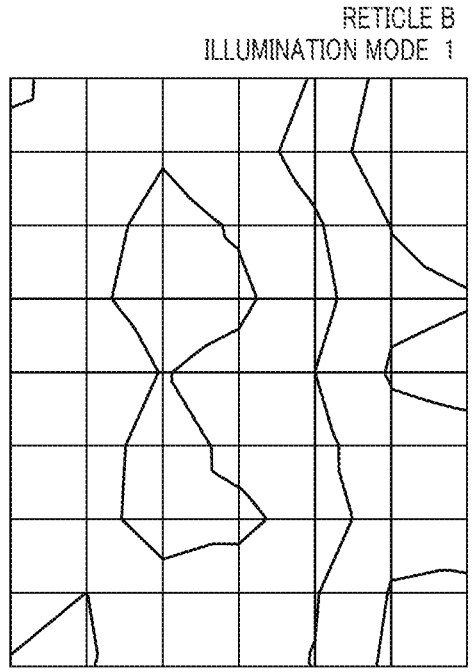
Figure 5D:
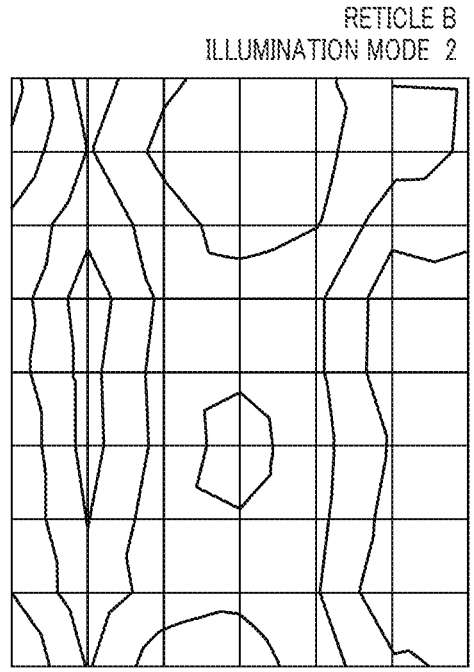

The film formation device 5 may further include a light source 307. Exposure light emitted from the light source 307 is reflected by a digital mirror device (DMD) module 306 that can change an illuminance distribution within an exposure region to an arbitrary profile, and is further bent to be irradiated to the process wafer 4. The process wafer 4 is aligned in position so that a luminous flux 308 whose exposure profile is changed by the DMD module 306 at the time of exposure matches a pattern on the wafer on the basis of the position of the process wafer 4 measured by the alignment scope 305. The exposure profile of the luminous flux 308 when the process wafer 4 is exposed by the film formation device 5 is shown in FIG. 4. FIG. 4A and FIG. 4B are contour diagrams showing examples of shapes of the image plane of the film formation device 5. Further, FIG. 4B is a schematic view of a cross-sectional structure of the substrate (here, a structure including the process wafer 4, the focus compensation film 3, the SOG film 2, and the resist layer 1) along line A-A' of FIG. 4A.

Contour lines of the exposure profile of the luminous flux 308 when the process wafer 4 is exposed by the film formation device 5 have a distribution as shown in FIG. 4A. Also, it is known that a shape of the curvature of field of the exposure device used in the pattern transfer process changes also due to an illumination mode of an illumination system, individual differences in the reticles, and a scan direction in the scan exposure. FIGS. 5A to 5D are contour diagrams showing other examples of shapes of the image plane of the film formation device. Also in such a case, since the exposure profile of the DMD module 306 can be prepared in advance for each shot and switched to be used for exposure, it can be handled without changing hardware.

Returning to FIG. 3, the DMD module 306 may be controlled by a DMD control unit 310. The DMD control unit 310 controls the DMD module 306 on the basis of the exposure profile received from the control unit 309 to be described later.

The film formation device 5 may further include the control unit 309. The control unit 309 may include a CPU, a memory, and the like. The CPU controls the entire film formation device 5 (each part of the film formation device 5) according to, for example, a computer program loaded from the memory. The control unit 309 controls a distribution of an integrated light amount of the DMD module 306 on the basis of, for example, residual film ratio characteristics of a composition, and at least one of a curved shape of the imaging plane of a template including a reticle or the like used in the subsequent process and a surface shape of the base film formed on the process wafer 4. Detailed configurations of the control unit 309 will be described later.

The luminous flux 308 of the present embodiment is irradiated to the process wafer 4 for each shot, and an integrated illuminance map of exposure light (=exposure profile) in the shot can be changed for each shot. The exposure profile defines an integrated exposure amount applied to the resist for the purpose of planarizing a surface of the focus compensation film 3 or forming a curved surface that matches the curvature of field of the subsequent exposure device. Therefore, as a feasible means of controlling illuminance, not only illuminance of exposure light, but also an exposure time (irradiation time of exposure light), and a total value of the integrated exposure amount corresponding to each wavelength sensitivity when a multi-wavelength light source is used may be a control knob. In a case of the DMD module 306, the integrated exposure amount (=illuminance*irradiation time) is controlled for each pixel to realize the exposure profile as shown in FIG. 4, by changing a ratio of a time when irradiation light from the UV light source 307 is reflected to a time when the light is blocked. That is, the DMD module 306 may be an optical modulation unit that forms a distribution of the integrated light amount of exposure light on the process wafer 4. Then, the distribution of the integrated exposure amount formed on the process wafer 4 is controlled by adjusting at least one of the illuminance, the wavelength, and the irradiation time.

As an example, the film formation device 5 illustrated in FIG. 3 is a step-and-repeat method in which a predetermined exposure profile is irradiated onto the process wafer 4 for each shot. That is, the film formation device 5 illustrated in FIG. 3 performs processing of forming the focus compensation film 3 for each shot region for a plurality of shot regions on the process wafer 4. However, in order to improve productivity, it is also possible to cause the film formation device 5 to expose a plurality of shots at one time, or to have an illumination function of providing an equivalent wide angle of view for exposing the entire wafer collectively. That is, the film formation device 5 can also perform processing of collectively forming the focus compensation film 3 for the plurality of shot regions on the process wafer 4. Also, if a pattern in which the exposure profile (DMD recipe) for each shot is fixed within the same wafer is allowed, a reticle on which grayscale tones are drawn may be loaded on a normal stepper to perform the same exposure processing. Here, the shot region refers to a unit region on the process wafer in which the pattern is formed.

Further, the resist used in the film formation device 5 according to the embodiment may be a positive type or a negative type as long as it is a developing type resist having sensitivity to exposure light.

FIG. 6 is a view for explaining a focus compensation film formation process according to the first embodiment. FIGS. 6A to 6F illustrate an order of forming the focus compensation film focusing on one shot on the process wafer in the order of time series. FIG. 6A is a base (base film) 401 of the process wafer on which an uneven pattern is formed. SOC is spin-coated in the process of FIG. 6B to form an SOC layer 402. The SOC layer 402 is directed at planarizing a component with short-period unevenness on the process wafer. The planarization by the SOC is not good for a component with long-period unevenness (for example, recessed part 404). In planarization by the SOC, a recessed part having a width of more than 5 μm in an XY direction has a problem that flatness of a surface shape cannot be sufficiently compensated because a surface shape of the SOC layer 402 follows a short-period unevenness shape of the wafer pattern as illustrated in the cross-sectional view of the SOC layer 402 in FIG. 6B. Therefore, a resist 403 is applied by means such as a spin coater or vacuum deposition in the process illustrated in FIG. 6C. Further, the SOC layer 402 is not always essential depending on required accuracy of a surface profile of the resist layer 1 to be obtained finally.

Figure 7:
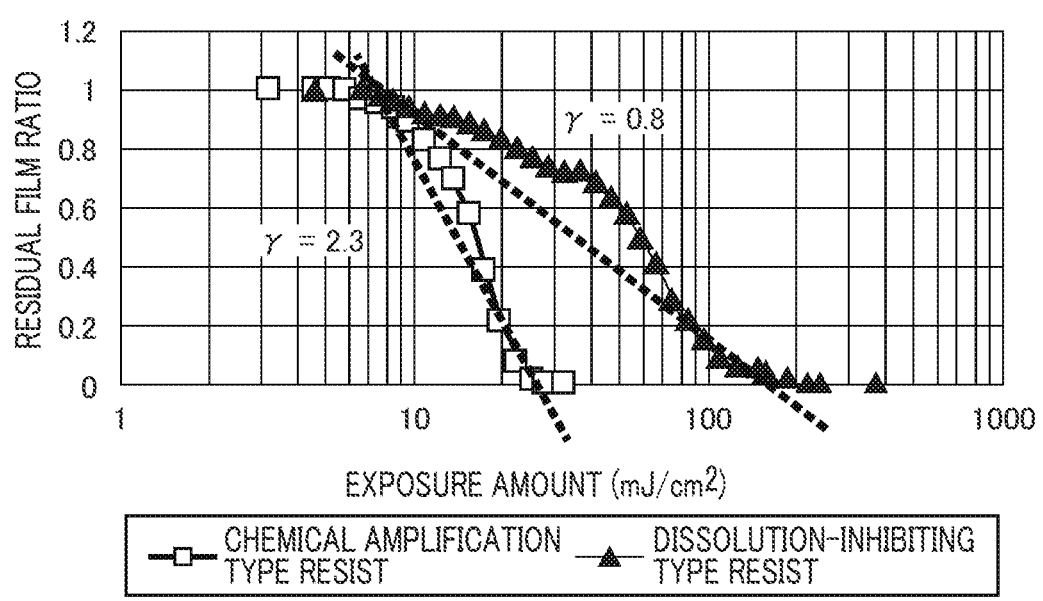
FIG. 7 is a diagram illustrating an example of a residual film ratio curve of a resist used for forming the focus compensation film.

FIG. 7 is a diagram illustrating an example of a residual film ratio curve of the resist 403 used for forming the focus compensation film. In the present embodiment, a chemical amplification type resist and a dissolution-inhibiting type resist are used as an example. If the characteristics in which a residual film ratio of the resist can be controlled by an exposure amount are utilized, a resist film thickness after development left on the wafer can be controlled to a desired thickness at an arbitrary position by controlling the exposure amount at each position on the wafer (shot). The film thickness after development is more easily controlled as the residual film ratio curve of the resist becomes more smooth. That is, a dissolution-inhibiting type resist is preferably used than a chemical amplification type resist Returning to the description of FIG. 6, in the process illustrated in FIG. 6D, the exposure light forming a predetermined exposure profile is irradiated for each shot of the process wafer coated with the resist 403. The formation of the predetermined exposure profile is realized by giving an integrated exposure amount profile in which a residual film amount after development has a desired thickness distribution to the DMD 306 that reflects and controls exposure light of the light source 307 having substantially uniform illuminance unevenness. In the present embodiment, the exposure profile is two-dimensional.

In the present embodiment, in the process illustrated in FIG. 6D, in a case of trying to planarize the surface, it is necessary to leave a low residual film ratio due to development in the portions i) and iv) to which the resist is applied, leave a residual film ratio higher than that in the portion ii), and leave a residual film ratio higher than that of the portion ii) in the portion iii). For that purpose, an optimum integrated exposure amount for each local region within a shot is obtained to have a thickness distribution that fills the surface unevenness of the SOC layer 402 on the basis of the integrated exposure amount and the residual film ratio characteristics of the resist 403 as in the example shown in FIG. 7. The surface unevenness of the SOC layer 402 is prepared, for example, by measuring or calculating it in advance.

As illustrated in FIG. 6E, when the wafer exposed with a specified exposure profile 410 is developed, a surface profile on the basis of an integrated exposure amount distribution appears on a resist surface. In the present embodiment, it is a flat surface. Further, the film thickness can be adjusted to a desired thickness by etching back as illustrated in FIG. 6F. In this way, components having fine undulation pitches (for example, less than 5 μm) on a surface step of the base 401 of the process wafer are planarized by SOC. Residual of gentle undulation pitches remaining thereon is finally planarized by forming the focus compensation film 3 having an arbitrary film thickness distribution by the process illustrated in FIG. 6D. That is, a planarized film is formed on the process wafer 4.

Figure 8:
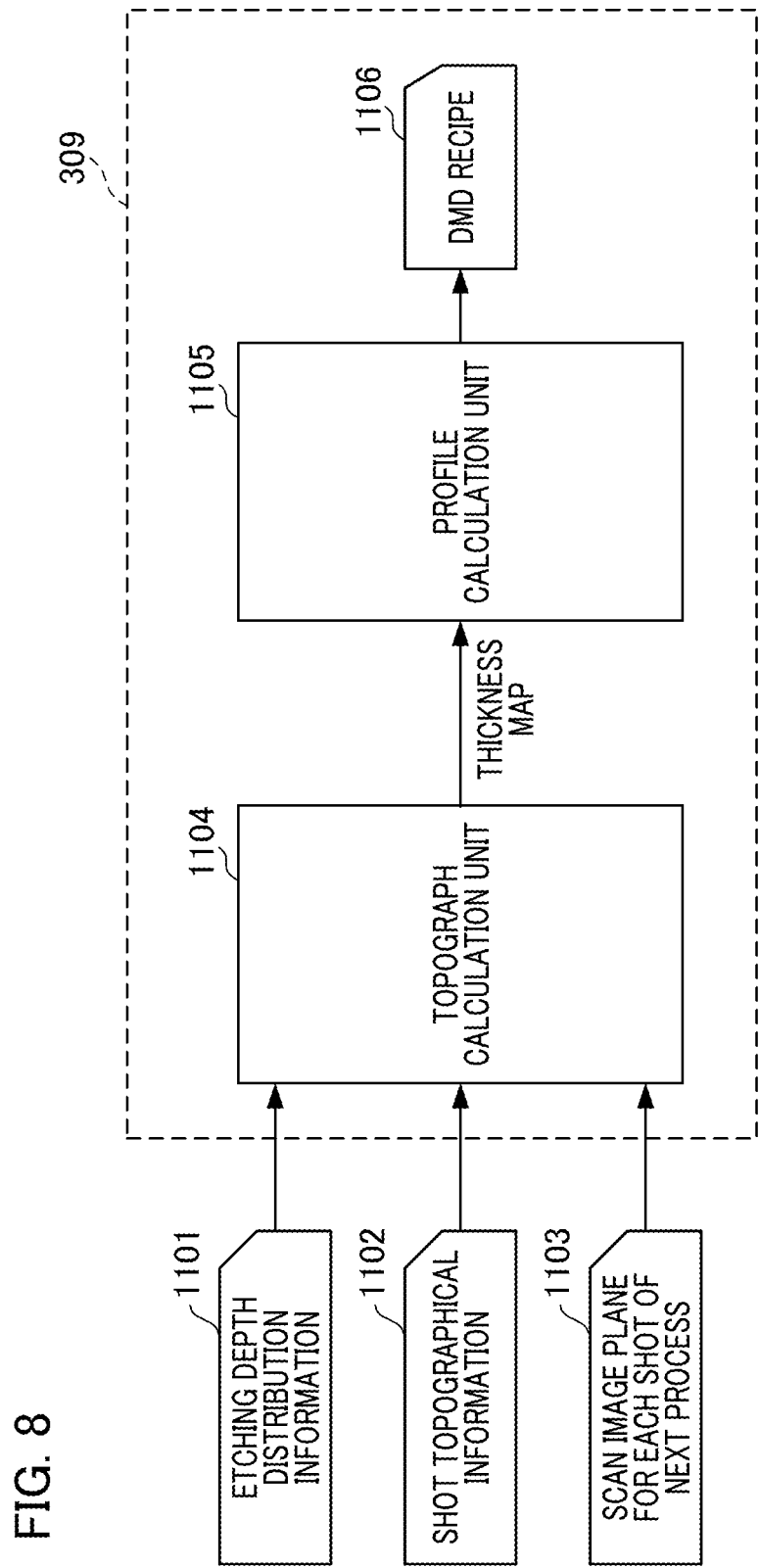
FIG. 8 is a schematic diagram showing an example of a software configuration of a control unit.

FIG. 8 is a schematic diagram showing an example of a software configuration of the control unit 309. The control unit 309 can include a topograph calculation unit 1104 and a profile calculation unit 1105. The control unit 309 generates an exposure profile, that is, a DMD recipe 1106, on the basis of at least one of self-measured values of an external measuring instrument and a device used in the subsequent process. In the present embodiment, it is assumed that unevenness information of the process wafer 4 uses measurement information obtained by measuring a plurality of shots in the wafer using an atomic force microscope (AFM) for the process wafer 4. The unevenness information of the process wafer 4 measured by the AMF is divided into a pattern-derived component that is common between shots and a component different between shots that is generated due to variations in etching depth within the wafer surface, or the like. The former is given to the topograph calculation unit 1104 as shot topographical information 1102 of the process wafer and the latter as etching depth distribution information 1101 of the wafer surface. On the other hand, the scan image plane (1103) of the exposure device used in the next process is given as different one for each exposure device, for each reticle, for each illumination mode, and for each scan direction. If it is used as a common framework for these variation factors, it is desirable that an input of the topograph calculation unit 1104 can be treated as a scan image plane that can be changed for each shot. When calculation processing is performed in the topograph calculation unit 1104, a thickness map of the focus compensation film 3 for each shot can be obtained. The profile calculation unit 1105 calculates an integrated exposure amount profile within a shot on the basis of the value described above, the integrated exposure amount and the residual film ratio characteristics of the resist 403, and an input interface and control performance of the DMD module 306 to be controlled. As a result, the DMD recipe 1106 defined for each shot is output.

Figure 9:
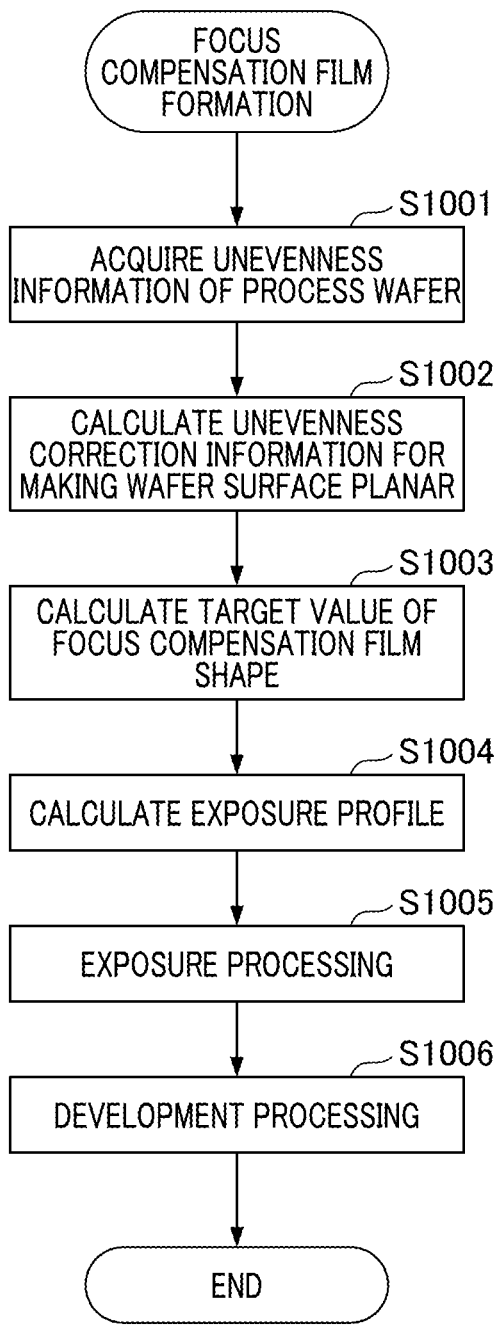
FIG. 9 is a flowchart of processing for creating an exposure profile according to the first embodiment.

FIG. 9 is a flowchart of processing for creating an exposure profile according to the first embodiment. Each operation (step) shown in this flowchart may be executed by the control unit 309. In the present embodiment, the control unit 309 controls a distribution of the integrated light amount of the DMD module 306 on the basis of the residual film ratio characteristics of the composition and the unevenness information of the process wafer 4, that is, the shot topographical information 1102 of the process wafer and the etching depth distribution information 1101 of the wafer surface.

In S1001, for example, topographic map information caused by the pattern is measured in advance by an external device, and the control unit 309 acquires this (S1003). As unevenness of the wafer surface, steps caused by a circuit pattern that repeats in units of shots and steps caused by etching in which shot positions are different between a vicinity of a wafer center and a vicinity of a wafer edge at the same position within a shot are known. Examples of obtaining information on the surface steps include a method of obtaining by calculation on the basis of a mask pattern of the base layer and etching process parameters, and a method of directly measuring the process wafer from an image of an AFM or a cross-sectional SEM. On the basis of the unevenness information on the surface of the process wafer obtained here, the control unit 309 calculates unevenness correction information (correction amount) for planarizing the unevenness (S1002). In this calculation step, removal of a 0th-order component, a 1st-order component, and the like is performed.

In S1003, the control unit 309 calculates a target value of a shape of the focus compensation film on the basis of the unevenness correction amount obtained in S1002. Thereafter, in S1004, the control unit 309 calculates a required exposure profile of a DMD illumination system on the basis of the integrated exposure amount and the residual film ratio characteristics of the resist 403 exemplified in FIG. 7. Then, the control unit 309 passes the calculated exposure profile to the DMD control unit 310, and exposure processing is performed in S1005. Thereafter, development processing is performed in S1006, and the processing ends.

According to the present embodiment, planarization is possible even for long-period unevenness on the substrate, and it is advantageous in that an exposure region of the substrate is caused to fall within the DOF of the exposure device.

Further, in the present embodiment, it is assumed that the device used in the subsequent process, that is, the device used in the process for forming a pattern on the process wafer 4, is different from the film formation device 5, but the subsequent process may be performed by the same film formation device 5. Also, when unevenness of the surface of the process wafer 4 which is common between shots such as the pattern-derived component is planarized, a mask corresponding to the surface shape of the process wafer 4 can also be used as the optical modulation unit. Also, the DMD module 306 and the above-described mask may be used together. Further, the control unit 309 and the DMD control unit 310 may not have to be separate bodies, and may be one control unit.

Also, the film formation device 5 may include a measurement unit for measuring at least one of a surface shape and a thickness of the formed focus compensation film 3. In this case, for example, the control unit 309 feeds back to adjust the exposure profile and the film thickness of the resist of the focus compensation film 3 on the basis of the measurement result of the measurement unit. With such a configuration, the planarization system of the surface of the process wafer 4 can be improved, and it is further advantageous in that the exposure region of the substrate is caused to fall within the DOF of the exposure device.

Second Embodiment

In a second embodiment, a control unit 309 controls a distribution of an integrated light amount of a DMD module 306 on the basis of residual film ratio characteristics of a composition and a curved shape of an imaging plane such as a reticle used in transfer. In the second embodiment, differences from the first embodiment will be mainly described. FIG. 10 is a view for explaining a focus compensation film formation process according to the second embodiment.

FIGS. 10A to 10E illustrate an order of forming the focus compensation film focusing on one shot on a process wafer in the order of time series.

The second embodiment is not a process for planarizing the process wafer, but a process directed at forming a curved surface following a scan image plane of an exposure device used in the subsequent process on a surface of the process wafer. After the focus compensation film is formed on the process wafer, the resist layer 1 described with reference to FIG. 1 is applied, and pattern transfer by the exposure device is performed.

Figure 10A:
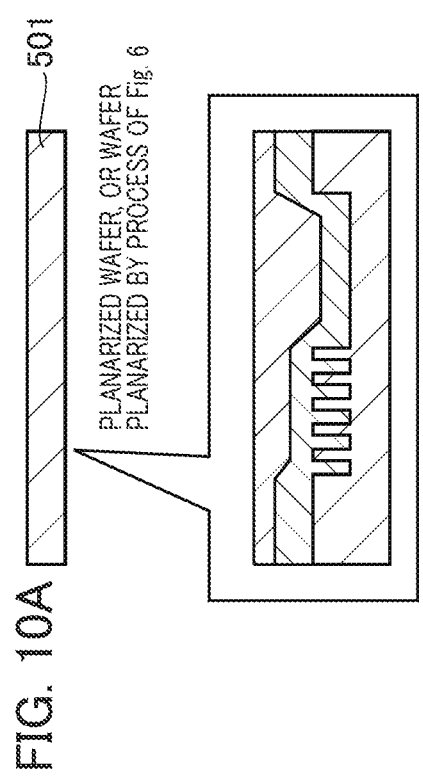
FIGS. 10A to 10E illustrate an order of forming the focus compensation film focusing on one shot on a process wafer in the order of time series.
Figure 10B:
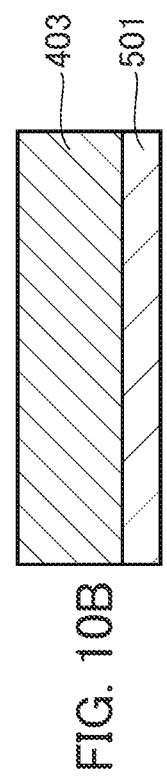
Figure 10C:
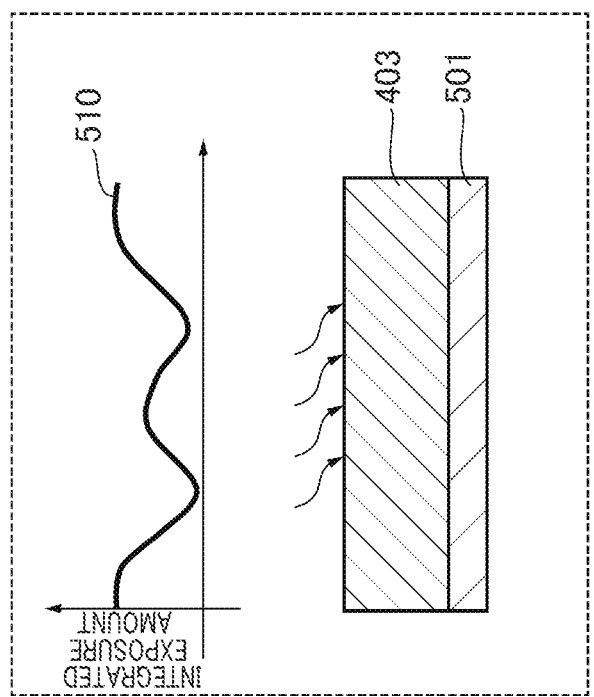

The process of FIG. 10A is a state of a process wafer 501 before a resist is applied, and it is assumed that a surface state thereof is in a state, for example, before wafer etching is performed or a state in which the surface is planarized by the process illustrated in FIG. 6. In the process of FIG. 10B, a resist 403 is applied onto the planarized process wafer 501. In the step illustrated in FIG. 10C, the applied resist 403 is irradiated with exposure light on the basis of an exposure profile prepared in advance. An integrated exposure amount map, which is an exposure profile 510, is calculated on the basis of a curvature of the scan image plane used in a pattern transfer process in the subsequent exposure device, and characteristics of an exposure amount and a residual film ratio of the resist (shown in FIG. 7), and is passed to a DMD control unit 310. The exposure profile is a target value data group in which an integrated exposure amount target value for each local region within a shot is defined. As the resist 403 described in the present embodiment, as an example, a resist having a relationship in which the residual film ratio at a portion to which an exposure energy is applied is small and the residual film ratio at an unexposed portion is large is used. Therefore, the exposure profile 510 given to the DMD module 306 is a target value of an undulation profile of a desired wafer surface in a reversed phase.

Figure 10D:
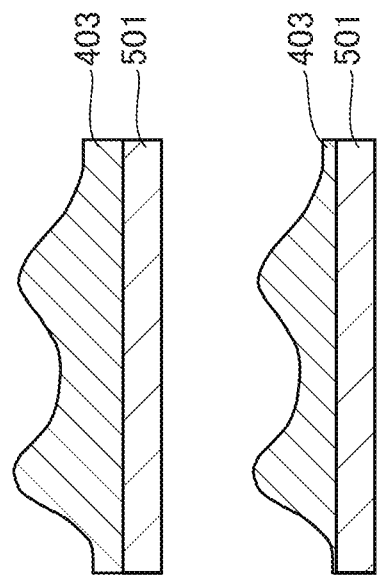
Figure 10E:
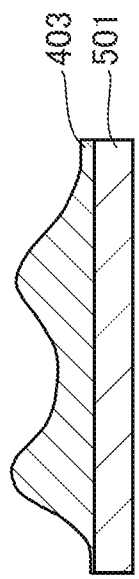

In the process illustrated in FIG. 10D, the exposed wafer described above is developed, and in the process illustrated in FIG. 10E, the resist at a thinnest portion is etched back until a film thickness thereof reaches a desired height. As described above, it is based on the premise that the surface state of the process wafer 501 of FIG. 10A has been planarized in applying the present second embodiment. As a method for planarizing the patterned wafer, the method disclosed in the first embodiment described above may be used. Also, a template called a super straight of a glass flat plate serving as a planarization reference is pressed against the wafer coated with the resist to cause a reflow of the resist. Then, a method in which the resist is cured by being irradiated with UV light when the resist has reached a state of following a surface of the glass substrate, and then the super straight is released may be used. Further, a technology such as chemical mechanical polishing (CMP) and SOC may also be used. That is, when (1) planarization and (2) undulation formation that matches the scan image plane of the next process are applied in that order as processing of the process wafer on which the pattern is formed, securing a focus margin for a narrow DOF system, which is the original purpose, can be realized.

Figure 11:
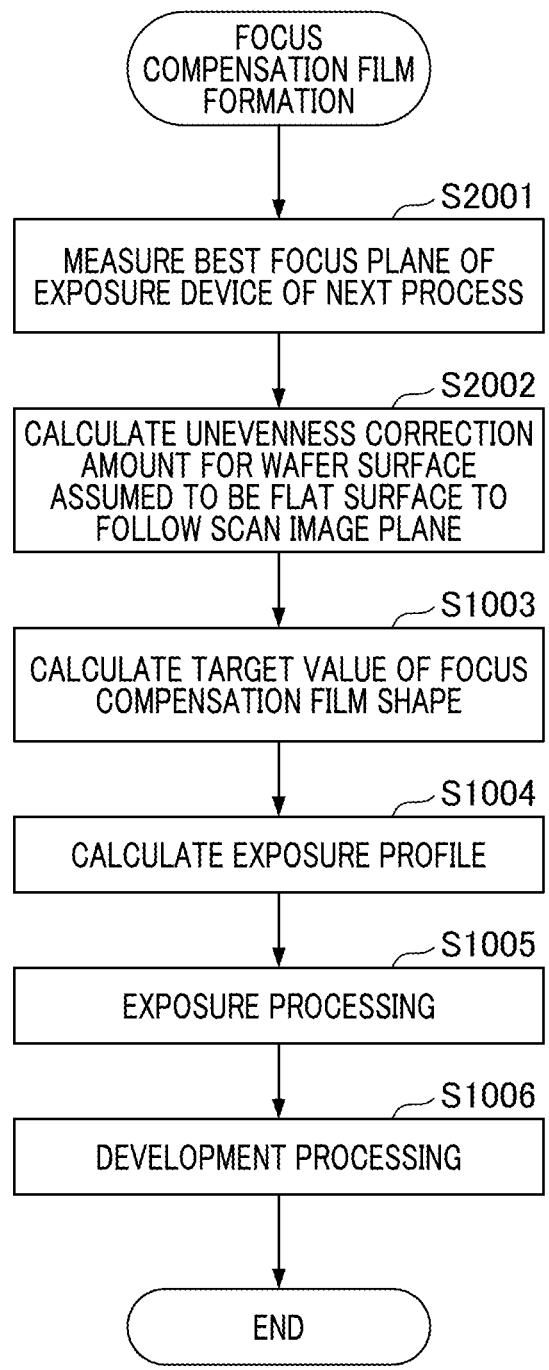
FIG. 11 is a flowchart of processing for creating an exposure profile according to the second embodiment.

FIG. 11 is a flowchart of processing for creating an exposure profile according to the second embodiment. Each operation (step) shown in the flowchart may be executed by the control unit 309. Steps the same as those shown in FIG. 9 are denoted by the same step numbers, and duplicate descriptions thereof will be omitted. In order to apply the processing of the present embodiment, it is necessary to specify an exposure device and a reticle to be used in the next process in advance.

In S2001, the control unit 309 obtains a specified focus plane, that is, a best focus plane by a combination of an exposure device and a reticle to be used in the subsequent process.

In S2002, the control unit 309 calculates a correction amount for the wafer surface, which is assumed to be a flat surface, to follow the scan image plane. Specifically, the control unit 309 subtracts a 0th-order component and a 1st-order component corrected by servo tracking, and low-order non-planar components (for example, up to a 2nd order) regarding a scanning direction in the subsequent exposure device from the best focus plane obtained in S2001, and sets it as the scan image plane. Since S1003 to S1006 are the same as those in FIG. 9, description thereof will be omitted.

According to the present embodiment, a focus compensation film having a surface shape corresponding to a shape of the image plane of the device used in the subsequent process can be formed, and an exposure region of the substrate can be caused to fall within the DOF of the exposure device.

Third Embodiment

The third embodiment is not a process for planarizing a process wafer, but a process directed at forming a curved surface following a scan image plane of an exposure device used in the subsequent process of transferring a pattern onto a substrate on a surface of the process wafer. After a focus compensation film is formed on the process wafer, the resist layer 1 described with reference to FIG. 1 is applied, and pattern transfer by the exposure device is performed.

FIG. 12 is a view for explaining a focus compensation film formation process according to a third embodiment. FIGS. 12A to 12F illustrate an order of forming the focus compensation film focusing on one shot on a process wafer in the order of time series.

Figure 12A:
FIGS. 12A to 12F illustrate an order of forming the focus compensation film focusing on one shot on a process wafer in the order of time series.
Figure 12B:
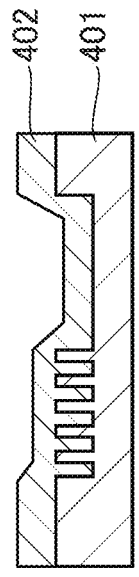
Figure 12C:
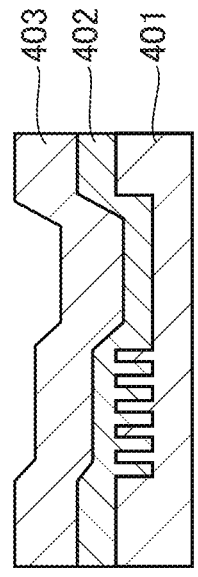

FIG. 12A is a view illustrating a base 401 of a process wafer on which an uneven pattern is formed. SOC is spin-coated in the process of FIG. 12B to form an SOC layer 402. The SOC layer 402 is the same as that illustrated in FIG. 6 of the first embodiment, and is directed at planarizing a component with short-period unevenness of a process wafer 4. The SOC layer 402 is directed at planarizing a component with short-period unevenness of the process wafer, but as in FIG. 6, it is not necessarily essential depending on required accuracy of a surface profile of the resist layer 1 to be finally obtained. In the process illustrated in FIG. 12C, a resist 403 also is the same as that described in FIG. 6 and is applied by means such as a spin coater or vacuum deposition.

Figure 12D:
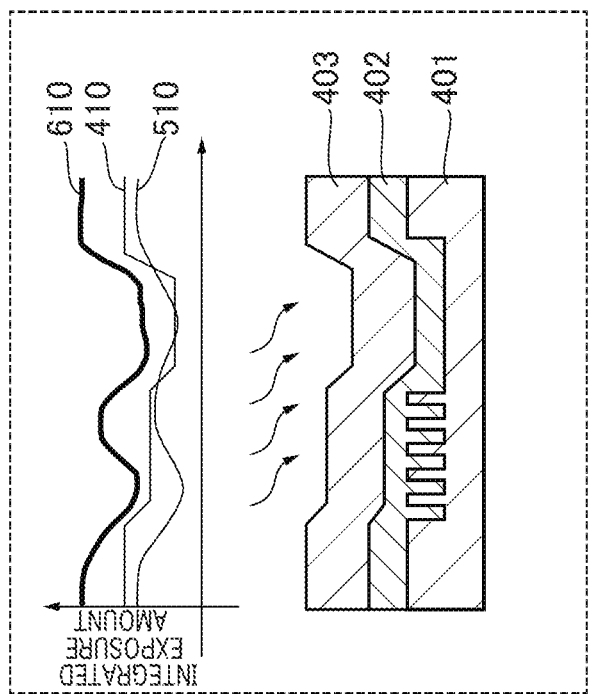
Figure 12E:
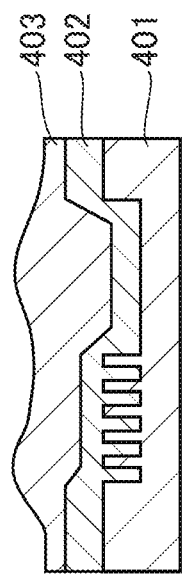
Figure 12F:
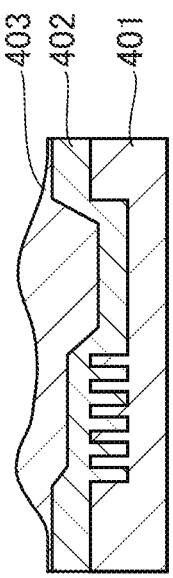

In the process illustrated in FIG. 12D, exposure light forming a predetermined exposure profile is irradiated for each shot of the process wafer coated with the resist. The formation of the predetermined exposure profile is realized by giving an integrated exposure amount profile in which a residual film amount after development has a desired thickness distribution to a DMD module 306 that reflects and controls exposure light of a light source 307 having substantially uniform illuminance unevenness. In the present embodiment, the exposure profile is two-dimensional. The exposure profile is different between FIG. 6 of the first embodiment and the third embodiment. The exposure profile 610 of the third embodiment is a total value of the exposure profile 410 for correcting long-period unevenness remaining on the surface of the SOC layer 402 and the exposure profile 510 for creating an undulation that matches the scan image plane of the exposure device used in a subsequent process. In the process illustrated in FIG. 12E, the exposed wafer described above is developed, and in the process illustrated in FIG. 12F, the resist of a thinnest portion is etched back until a film thickness thereof reaches a desired height.

Figure 13:
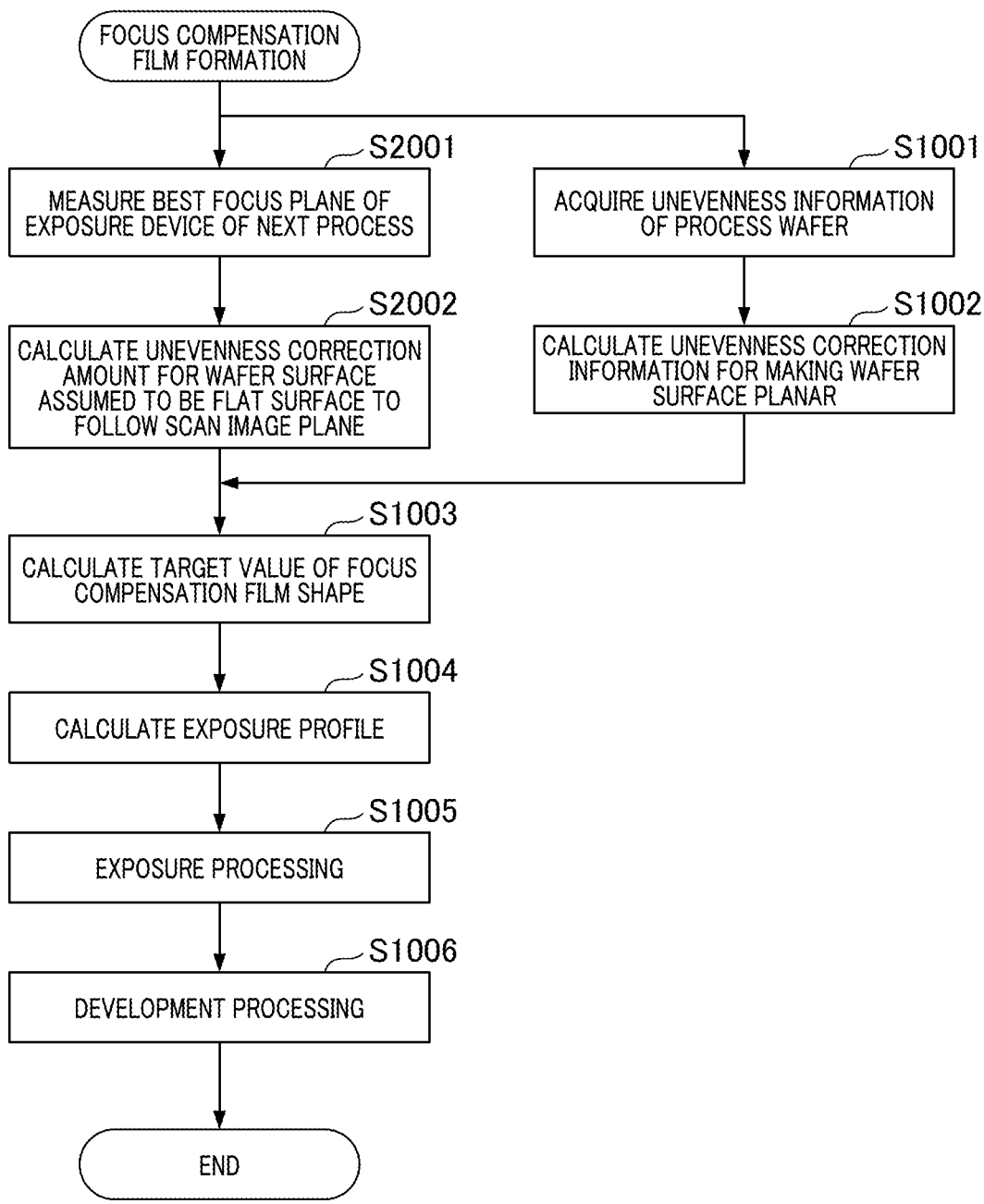
FIG. 13 is a flowchart of processing for creating an exposure profile according to the third embodiment.

FIG. 13 is a flowchart of processing for creating an exposure profile according to the third embodiment. Each operation (step) shown in the flowchart may be executed by a control unit 309. Steps the same as those shown in FIGS. 9 and 11 are denoted by the same step numbers, and duplicate descriptions thereof will be omitted. In order to apply the processing of the present embodiment, it is necessary to specify an exposure device and a reticle to be used in the next process in advance.

In the flow of the present embodiment, both the processes S1001 to S1002 and S2001 to S2002 are performed. Further, S1001 to S1002 and S2001 to S2002 may be performed in parallel. Detailed descriptions are the same as those in FIGS. 9 and 11, and will be omitted. Since descriptions on S1003 to S1006 are the same as those in FIG. 9, descriptions thereof will be omitted.

According to the present embodiment, planarization of the process wafer illustrated in FIG. 6 of the first embodiment and the process of creating undulations that match the scan image plane of the exposure device used in the subsequent process illustrated in the second embodiment can be handled by a single process of forming the focus compensation film.

As described above, the above-described embodiment is performed prior to exposure processing in a narrow DOF lithography device such as an ArF immersion exposure device and an EUV exposure device. In the above-described embodiment, process-derived surface steps of the process wafer to be exposed are planarized, and in addition, a curved surface-shaped thin film (focus compensation film) for compensating the reproducible scan image plane component of the above-described lithography device is formed in advance. Then, when a photoresist layer is formed thereon, a defocus factor on the lithography device side is corrected in a feedforward manner. Particularly, when the focus compensation film is formed, a resist whose interval changes proportionally to an absorbed exposure energy is longer than that of the SOC is used. Then, when the integrated exposure amount exposing the same resist is changed for each local region to form an arbitrary film thickness, a shape of the wafer surface to be feedforwarded described above is formed.

Embodiment of Article Manufacturing Method

Hereinafter, an article manufacturing method according to one embodiment of the present invention will be described. The article manufacturing method may include a process of forming a film on a substrate by the above-described film formation device or a film formation method, and a process of disposing a photoresist film on the film on the substrate. The photoresist film may be disposed on the film using, for example, a coating device such as a spin coater. Also, the article manufacturing method may include a process of patterning the photoresist film by an exposure and development process to form a photoresist pattern, and a process of processing the substrate using the photoresist pattern. Exposure of the photoresist film may be performed using an exposure device and, preferably a scanning exposure device.

In the article manufacturing method, an article is manufactured from the substrate S that has undergone the processes described above.

Other Embodiments

While preferred embodiments of the present invention have been described above, the present invention is not limited to these embodiments, and various variations and modifications can be made within the scope of the gist of the present invention.

Also, the present invention can also be realized by supplying a program that realizes one or more functions of the above-described embodiments to a system or a device via a network or a storage medium, and causing one or more processors in a computer of the system or the device to read and execute the program. Also, the present invention can also be realized by a circuit (for example, ASIC) that realizes one or more functions of the above-described embodiments.

This application claims the benefit of the previously filed Japanese Patent Application No. 2020-29576 filed on Feb. 25, 2020. Also, the contents of this Japanese patent application are incorporated in the present specification by reference in their entirety.

What is claimed is:

1. A film formation device for forming a film of a composition on a substrate by irradiating the composition on the substrate with light, comprising:
   at least one processor or circuit configured to function as:
   an optical modulation unit configured to form a distribution of an integrated light amount of the light on the substrate; and
   a measurement unit configured to measure at least one of a curved shape of an imaging plane of an original plate used in a subsequent process, a surface shape and a thickness of the film of the composition formed on the substrate;
   a control unit configured to control the optical modulation unit,
   wherein the control unit controls the distribution of the integrated light amount of the optical modulation unit on the basis of residual film ratio characteristics of the composition and at least one of a curved shape of an imaging plane of an original plate used in a subsequent process and a surface shape of a base film formed on the substrate, and
   the control unit corrects the integrated light amount on the basis of a measurement result of the measurement unit.

2. The film formation device according to claim 1, wherein the subsequent process is a process of transferring a pattern of the original plate to the substrate by an exposure device.

3. The film formation device according to claim 1, wherein the control unit controls the distribution of the integrated light amount so that a film corresponding to the curved shape of the imaging plane is formed on the substrate on the basis of the curved shape of the imaging plane.

4. The film formation device according to claim 3, wherein a film corresponding to the curved shape of the imaging plane is formed on a planarized film.

5. The film formation device according to claim 1, wherein the control unit controls the distribution of the integrated light amount to form a planarized film on the substrate on the basis of the surface shape of the base film formed on the substrate.

6. The film formation device according to claim 1, wherein the control unit controls the integrated light amount using at least one of an illuminance, a wavelength, and an irradiation time of the light.

7. The film formation device according to claim 1, wherein processing for forming the film is performed on a plurality of shot regions of the substrate collectively or for each shot region.

8. The film formation device according to claim 1, wherein the control unit controls the integrated light amount on the basis of a depth of unevenness on the surface of the base film formed on the substrate.

9. The film formation device according to claim 1, wherein the composition includes a dissolution-inhibiting type resist.

10. The film formation device according to claim 1, further comprising:
    at least one processor or circuit configured to function as:
    a substrate holding unit configured to hold and moving the substrate on which a pattern of the composition is formed,
    wherein the control unit controls the substrate holding unit on the basis of a shape of the pattern and the distribution of the integrated light amount formed on the substrate.

11. The film formation device according to claim 1, wherein the optical modulation unit includes either a digital mirror device or a mask for forming the distribution of the integrated light amount.

12. A film formation method for forming a film of a composition on a substrate by irradiating the composition on the substrate with light, comprising:
    a process of measuring at least one of a curved shape of an imaging plane of an original plate used in a subsequent process, a surface shape and a thickness of the film of the composition formed on the substrate,
    a process of forming a distribution of an integrated light amount of the light on the substrate,
    wherein the distribution of the integrated light amount is determined on the basis of residual film ratio characteristics of the composition and at least one of a curved shape of an imaging plane of an original plate used in a subsequent process and a surface shape of a base film formed on the substrate.

13. An article manufacturing method for manufacturing an article from a substrate, comprising:
    a process of measuring at least one of a curved shape of an imaging plane of an original plate used in a subsequent process, a surface shape and a thickness of the film of the composition formed on the substrate,
    a process of forming a film of a composition on the substrate by irradiating the composition on the substrate with light;
    a process of forming a distribution of an integrated light amount of the light on the substrate,
    wherein the distribution of the integrated light amount is determined on the basis of residual film ratio characteristics of the composition and at least one of a curved shape of an imaging plane of an original plate used in a subsequent process and a surface shape of a base film formed on the substrate;
    a process of disposing a photoresist film on the film;
    a process of patterning the photoresist film by exposure and development processes to form a photoresist pattern; and a process of processing the substrate using the photoresist pattern.

* * * * *